United States Patent
Gilet et al.

(10) Patent No.: US 8,535,962 B2
(45) Date of Patent: Sep. 17, 2013

(54) METHOD FOR MAKING A LIGHT-EMITTING MICROELECTRONIC DEVICE WITH SEMI-CONDUCTING NANOWIRES FORMED ON A METAL SUBSTRATE

(75) Inventors: Philippe Gilet, Quentin sur Isere (FR); Pierre Ferret, Grenoble (FR); Pascal Gentile, Voiron (FR); Alexei Tchelnokov, Grenoble (FR); Thierry Baron, Saint Egreve (FR)

(73) Assignee: Commissariat a l'Energie Atomique, Paris (FR)

( * ) Notice: Subject to any disclaimer, the term of this patent is extended or adjusted under 35 U.S.C. 154(b) by 136 days.

(21) Appl. No.: 12/302,805

(22) PCT Filed: Jun. 8, 2007

(86) PCT No.: PCT/EP2007/055661
§ 371 (c)(1),
(2), (4) Date: Nov. 28, 2008

(87) PCT Pub. No.: WO2007/141333
PCT Pub. Date: Dec. 13, 2007

(65) Prior Publication Data
US 2009/0246901 A1    Oct. 1, 2009

(30) Foreign Application Priority Data
Jun. 9, 2006   (FR) .................................... 06 52075

(51) Int. Cl.
*H01L 33/00* (2010.01)

(52) U.S. Cl.
USPC .......... 438/29; 257/88; 257/E33.006; 977/950

(58) Field of Classification Search
USPC ................. 257/88–97, E33.006; 438/22–47; 977/950, 952
See application file for complete search history.

(56) References Cited

U.S. PATENT DOCUMENTS

| | | | |
|---|---|---|---|
| 7,947,989 B2* | 5/2011 | Ha et al. ........................... | 257/79 |
| 2002/0007006 A1* | 1/2002 | Kanamori et al. ............. | 524/588 |
| 2003/0168964 A1* | 9/2003 | Chen ............................. | 313/495 |

(Continued)

FOREIGN PATENT DOCUMENTS

| | | |
|---|---|---|
| WO | 02 080280 | 10/2002 |
| WO | 2004 087564 | 10/2004 |
| WO | 2005 048297 | 5/2005 |
| WO | 2006 000790 | 1/2006 |

OTHER PUBLICATIONS

Kikuchi, Akihiko et al., "InGaN/GaN Multiple Quantum Disk Nanocolumn Light-Emitting Diodes Grown on (111) Si Substrate", Japanese Journal of Applied Physics, Express Letter, vol. 43, No. 12A, pp. L1524-L1526, (2004).

(Continued)

*Primary Examiner* — Julio J Maldonado
*Assistant Examiner* — Daniel Shook
(74) *Attorney, Agent, or Firm* — Oblon, Spivak, McClelland, Maier & Neustadt, L.L.P.

(57) ABSTRACT

A process of making a microelectronic light-emitting device, including: a) growth on a metallic support of multiple wires based on one or more semi-conducting materials designed to emit radiant light, and b) formation of at least one electrical conducting zone of contact on at least one of the wires.

16 Claims, 4 Drawing Sheets

(56) References Cited

U.S. PATENT DOCUMENTS

| | | | |
|---|---|---|---|
| 2005/0167680 A1* | 8/2005 | Shei et al. | 257/79 |
| 2005/0199886 A1* | 9/2005 | Yi et al. | 257/79 |
| 2005/0253137 A1* | 11/2005 | Whang et al. | 257/40 |
| 2006/0207647 A1* | 9/2006 | Tsakalakos et al. | 136/256 |
| 2007/0235738 A1* | 10/2007 | Jin et al. | 257/79 |

OTHER PUBLICATIONS

Beresford, R. et al., "Group IVB refractory metal crystals as lattice-matched substrates for growth of the group III nitrides by plasma-source molecular beam epitaxy", Journal of Crystal Growth, Elsevier, vol. 178, No. 1-2, pp. 189-200, (1997).

Hiruma, Kenji et al., "GaAs free-standing quantum-size wires", J. Appl. Phys., vol. 74, No. 5, pp. 3162-3171, (1993).

Kim, Hwa-Mok et al., "High-Brightness Light Emitting Diodes Using Dislocation-Free Indium Gallium Nitride/Gallium Nitride Multiquantum-Well Nanorod Arrays", Nano Letters, vol. 4, No. 6, pp. 1059-1062, (2004).

Kipshidze, G. et al., "Controlled growth of GaN nanowires by pulsed metalorganic chemical vapor deposition", Applied Physics Letters, vol. 86, No. 3, pp. 33104-1 to 33104-3, (2005).

\* cited by examiner

METHOD FOR MAKING A LIGHT-EMITTING MICROELECTRONIC DEVICE WITH SEMI-CONDUCTING NANOWIRES FORMED ON A METAL SUBSTRATE

TECHNICAL FIELD

The technical field to which relates the invention is that of microelectronics and optoelectronics and more specifically the making of light emitters based on semiconducting materials.

The invention relates to a method for making a light-emitting device comprising a plurality of nanowires formed on a metal substrate.

PRIOR ART

The making of a light-emitting microelectronic device, for example of the LED (<<Light Emitting Device>> or electroluminescent device) type may be currently carried out with successive epitaxies of several thin layers of semiconducting materials. Sapphire-based substrates, or substrates based on silicon carbide are generally used for forming this type of device. The size of these substrates is often smaller than 3 inches (7.62 centimeters), which limits the number of LEDs which may be integrated onto a same substrate.

For example, for a LED emitting light at 450 nm, the following stack may be made: on a sapphire type substrate 1, a buffer layer 2 based on N-doped GaN is formed and used as a lower contact point 3, and then a plurality of quantum wells is respectively formed in a InGaN-based layer and a superposed GaN-based layer, and then a magnesium-doped GaN layer 5 and finally a thin GaN strongly P-doped layer 6 on which an upper contact 7 is formed (FIG. 1A and FIG. 1B).

Lattice mismatch between the sapphire (substrate) and GaN of the buffer layer is generally large, which induces a high rate of dislocations in the other semiconducting layers. On the other hand, taking into account the insulating character of sapphire, the making of the lower contact requires etching of the active layer 4, which makes the making method cumbersome. With such an arrangement of the lower contact, current injection is not homogeneous on the lower face of the diode. Moreover, when the device is operating, the active layer 4 is capable of emitting light in all directions. As the sapphire (substrate) 1 is a material which is transparent at the emission wavelength of the diode, about half of the light emitted towards the rear face is lost. As the sapphire substrate is electrically insulating, a thin layer of doped semiconducting material is generally formed on the latter, in order to be able to make a ground plane. The electric conductivity of the layer which ensures passing of the current, for example based on N-doped GaN, is generally low. When the current passes inside the diode, the result is significant heating of the device by the Joule effect. This significant heating due to poor dissipation of heat by the substrate 1 (the heat conductivity of the sapphire substrates generally being of the order of 35-40 W/mK), may induce fast degradations of the material and reduce the reliability of the active layer of the LED. Such a kind of heating may reduce the electric properties of the active layer and deteriorate the yield of the LED.

In document WO 02/080208 A1, the making of a light-ray emitting microelectronic device including nanowires which are grown on a support, was contemplated.

As for document US 2003/01 68964 A1, it presents a method for making a LED formed with nanowires made on a semitransparent conductive substrate. In this method, growing the nanowires is carried out on a semitransparent conducting layer of the ITO (Indium Tin Oxide) type or based on ZnO. The electrical performances and those in terms of yield of such a device may prove to be insufficient.

The problem is posed of finding a new light-emitting microelectronic device with semiconducting nanowires as well as a novel method for making such a device.

DISCUSSION OF THE INVENTION

The invention relates to a method for making a light-emitting microelectronic device, comprising the steps of:

a) growing on a metal support a plurality of wires based on one or several semiconducting materials capable of emitting light radiation, b) forming at least one electrically conducting contact area on at least one of said wires.

Growing the wires is carried out on a metal layer of said support.

Thus, the present invention provides a method for making a light-emitting microelectronic device comprising the steps of:

a) growing on a continuous metal substrate layer belonging to a metal support or on a thin continuous metal layer of a metal support, a plurality of wires based on one or several semiconducting materials capable of emitting light radiation, b) forming at least one electrically conducting contact area on at least one of said wires.

According to one possibility, the support may comprise a substrate based on a metal or a metal alloy, the metal or metal alloy comprising at least one of the following materials: iron, nickel, aluminum, silver, copper, stainless steel, iron and Ni alloy such as Invar®.

The wires formed in step a) may be in contact with the substrate.

According to one alternative, for which the substrate is covered with a thin conducting or semiconducting layer, the wires formed in step a) may be in contact with said thin layer.

Said thin layer may be provided in order to reflect said light radiation.

The method may also comprise, prior to step a), the deposition of a catalyst material layer on the metal support.

The method may also comprise between step a) and step b), the formation of an insulating layer for encapsulating the wires.

SHORT DESCRIPTION OF THE DRAWINGS

The present invention will be understood upon reading the description of exemplary embodiments, given purely as an indication and by no means as a limitation, with reference to the appended drawings wherein.

Identical, similar, or equivalent portions of the different figures bear the same numerical references so as to facilitate passing from one figure to the other.

The different portions illustrated in the figures are necessarily illustrated according to a uniform scale, in order to make the figures more legible.

DETAILED DISCUSSION OF PARTICULAR EMBODIMENTS

An exemplary method for making, according to the invention, a light-emitting (LED) microelectronic device, will now be given in connection with FIGS. 2A-2D. The starting material of the method is a substrate 100 which may be based on a metal, for example such as aluminium or silver or copper, or a metal alloy for example based on aluminium or silver or copper, or such as stainless steel or a FeNi alloy, including iron and nickel such as Invar® (registered trade mark by Goodfellow). The metal substrate 100 may have a thickness for example comprised between 10 μm and 10 mm, or for example of the order of 1 mm, and a surface for example comprised between 100 mm$^2$ and 1 m$^2$, or for example of the order of 300 mm$^2$.

A step for preparing the substrate 100 and in particular a given face of the latter with view to growing wires based on one or several semiconducting materials, may be achieved by means of a surface treatment, for example comprising a step for degreasing the substrate with a solvent, for example based on acetone and ethanol, and a step for removing rough spots for example by polishing on a felt. A material 101 intended to be used as a catalyst may then be deposited as a thin layer for example of the order of 5 nm on said given face of the substrate 100. The catalyst material 101 may for example be gold or nickel, formed by evaporation. Next, a plurality of wires 102, so-called <<nanowires>>, based on one or more semiconducting materials capable of emitting light radiation are grown on the substrate 100. The nanowires 102 may be made by epitaxy.

Figure 1A:
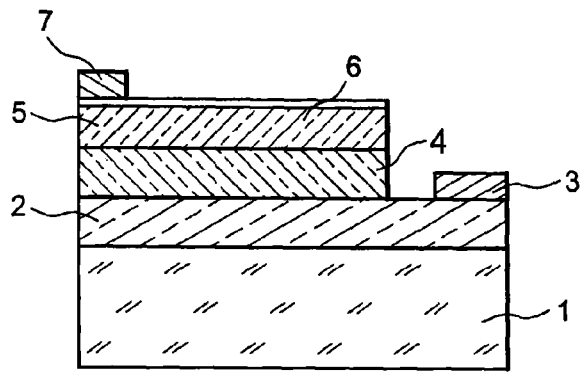
FIGS. 1A-1B illustrate a microelectronic device of the LED type according to the prior art, according to a sectional view and according to a top view, respectively.
Figure 1B:
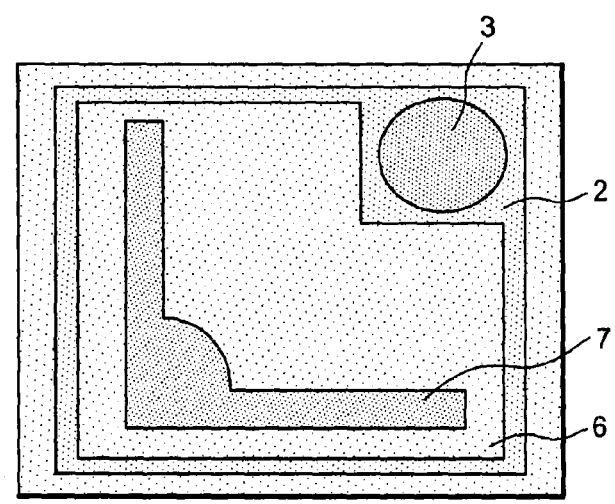
Figure 2A:
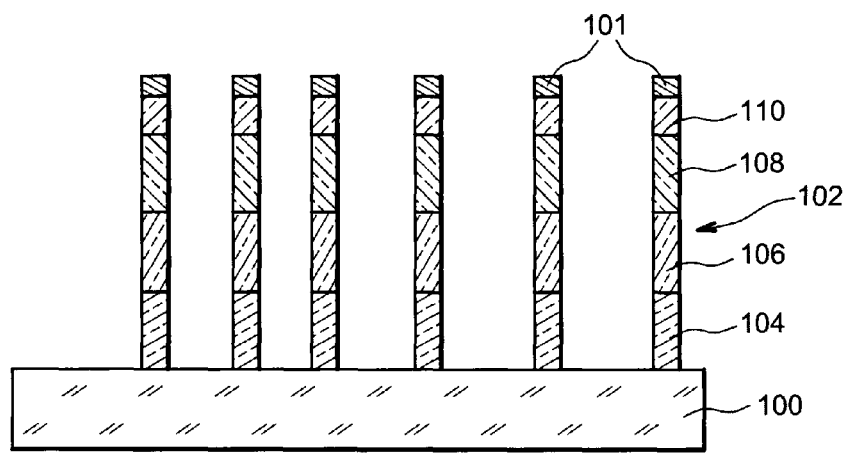
FIGS. 2A-2D illustrate a method according to the invention for making a microelectronic device of the LED type provided with nanowires formed on a metal substrate.
Figure 2B:
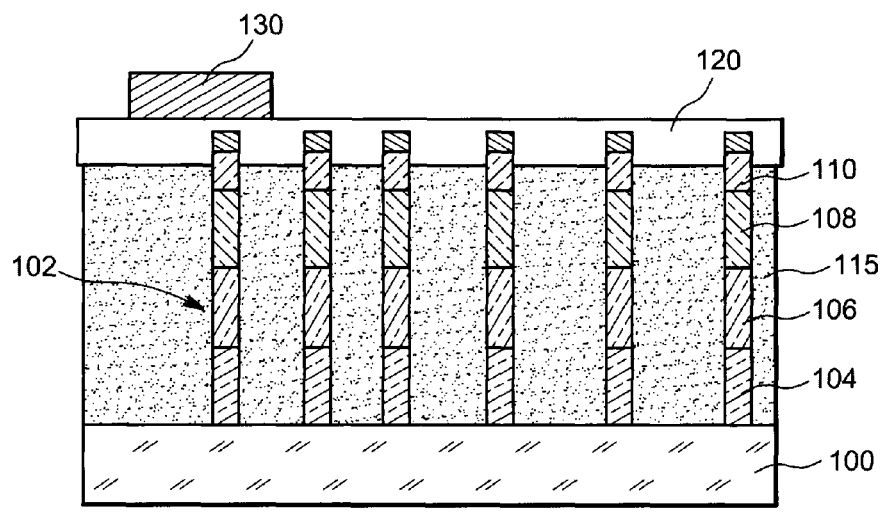
Figure 2C:
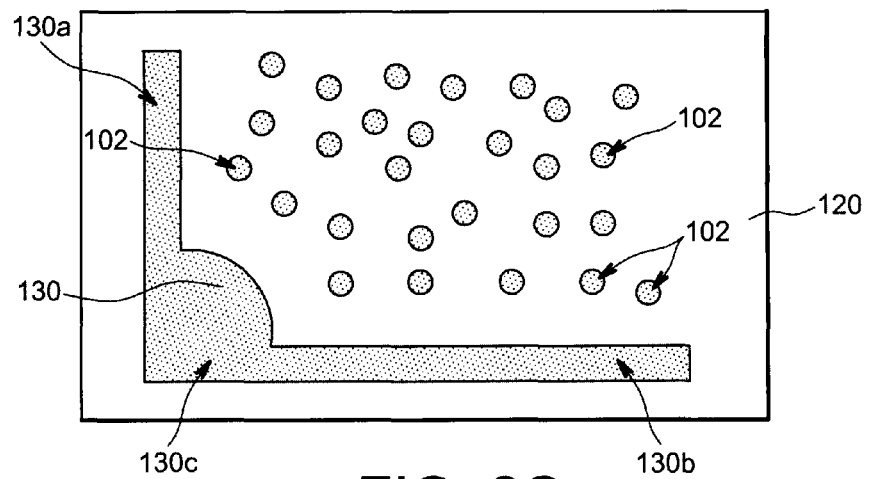

The nanowires 102 are intended to grow in a direction forming a non-zero angle, for example in a direction orthogonal to the main plane of the substrate 100 (the main plane of the substrate 100 being defined as a plane passing through the substrate 100 and parallel to the [O; $\vec{i}$; $\vec{k}$] plane of an orthogonal coordinate system [O; $\vec{i}$; $\vec{j}$; $\vec{k}$] in FIG. 2A). The nanowires 102 which are grown, may be formed by one or several portions including gallium nitride or a compound based on gallium nitride. For this, the metal substrate 100 may be for example placed in a chamber of a MOCVD (method for chemical vapor deposition of semiconducting material or metal from organic materials) type reactor. The substrate 100 is brought to a high temperature for example of the order of 500-800° C. in order to put the catalyst material 101 into the form of droplets and making it active. Next, one or more precursors are introduced into the reaction chamber. In order to make a first portion 104 of the wire 102 based on a first material, for example N-doped GaN in contact with the metal substrate 100, precursors such as trimethylgallium and ammonia may for example be injected into the chamber of the reactor. N type doping of the first portion 104 may be achieved by injecting silane. During the growth of the nanowires 102, the temperature of the substrate 100 may for example be comprised between 500° C. and 1,000° C. The chemical composition of the nanowires 102 is intended to vary along their axis of growth. The first portion 104 of the quantum wires of the N-doped GaN may for example be covered with a second portion 106 in which quantum wells based on InGaN and GaN may be formed. The second portion may be covered by a third portion 108, for example based on P-doped GaN, itself covered by a fourth portion 110 based on P++ doped GaN, and being used for example as contact point(s). P-type doping may be achieved for example by injecting an organometallic compound based on Mg. Once the nanowires 102 are formed, the end of the latter may be covered with a catalyst material 101. The obtained nanowires 102 may have a diameter (measured in a direction parallel to the $\vec{i}$ vector of the orthogonal coordinate system [O; $\vec{i}$; $\vec{j}$; $\vec{k}$]) for example comprised between 5 nanometers and 500 nanometers and a length for example comprised between 100 nanometers and 10 micrometers (measured in a direction parallel to the $\vec{j}$ vector of the coordinate system [O; $\vec{i}$; $\vec{j}$; $\vec{k}$]). The change in chemical composition along the wires 102 is obtained by changing during the growth process of the chemical composition, the concentration of the gases introduced into the reactor, combined with a change in temperature at which the substrate 100 is placed (FIG. 2A).

An encapsulation layer may then be formed on the substrate 10, and on either side of the nanowires 102, so that the nanowires 102 are inserted into the encapsulation layer 115. A portion of the nanowires 102, for example a part of the fourth portion 110 of the latter, juts out from the encapsulation layer 115. The encapsulation layer 115 may be based on a dielectric material selected so as to impart proper flatness. The encapsulation layer 115 may for example be based on benzocyclobutene (BCB) or polystyrene and may be made by deposition for example.

Next, an upper contact 120 may be formed on the encapsulation layer 115 so as to cover the end of the wires jutting out from the encapsulation layer 115. The upper contact 120 may for example be formed by depositing a layer of electrically conducting and semitransparent material such as ITO (Indium Tin Oxide), or a thin Ti layer for example of the order of 5 nanometers, covered by another thin layer of Au for example, of the order of 5 nanometers, or a deposit of carbon nanotubes.

Next, a contact point metal area 130 may be formed on the contact 120. The metal area 130 may be made for example by depositing a layer of Ti of the order of 10 nanometers, followed by a gold layer of the order of 200 nanometers, and then by etching these layers, so as to form a pattern (FIG. 2B in which the device is illustrated according to a sectional view, and FIG. 2C, the device being illustrated according to a top view). The contact area may include one or several portions 130a, 130b, intended to transport an electric current. The contact area may optionally include a portion 130c provided for receiving a weld.

Figure 2D:
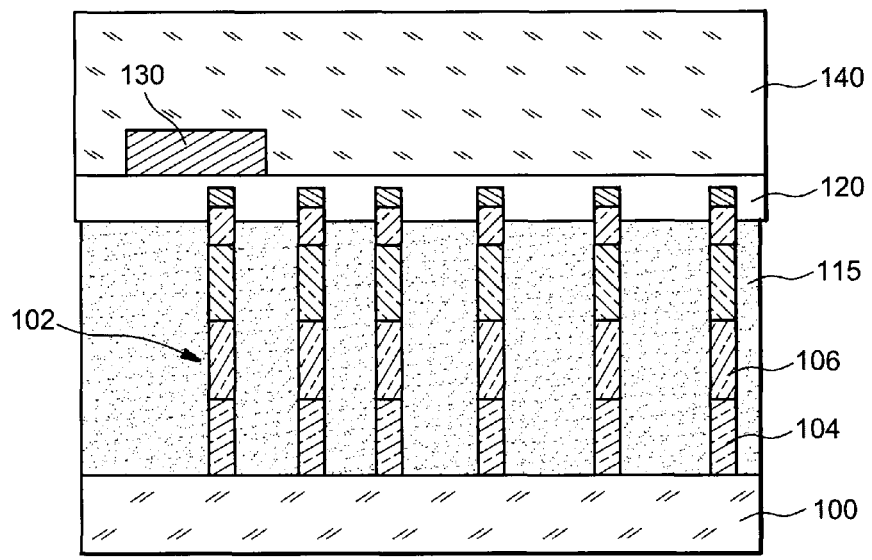

A so-called <<phosphor>> or <<luminophor>>, material layer 140 or/and capable of converting quasi-monochromatic light into so-called white light, may then be made, so as to cover the contacting metal area 130 and the contact 120. The material 140 may for example be cerium-doped YAG (yttrium-aluminium garnet) material or $Y_3Al_5O_{12}$:Ce3+ (FIG. 2D). As the substrate 100 is metal, the latter may be intended for forming a second contact, and may form a ground plane for example. The metal substrate 100 is also intended to reflect light radiations capable of being emitted by the nanowires 102. Light radiation emitted towards the rear face of the device, in other words towards the substrate 10, may be reflected and redirected towards the front face. In a case when the substrate 100 is based on silver or aluminium, reflectivity may be above 85% for radiations above 380 nm.

Figure 3:
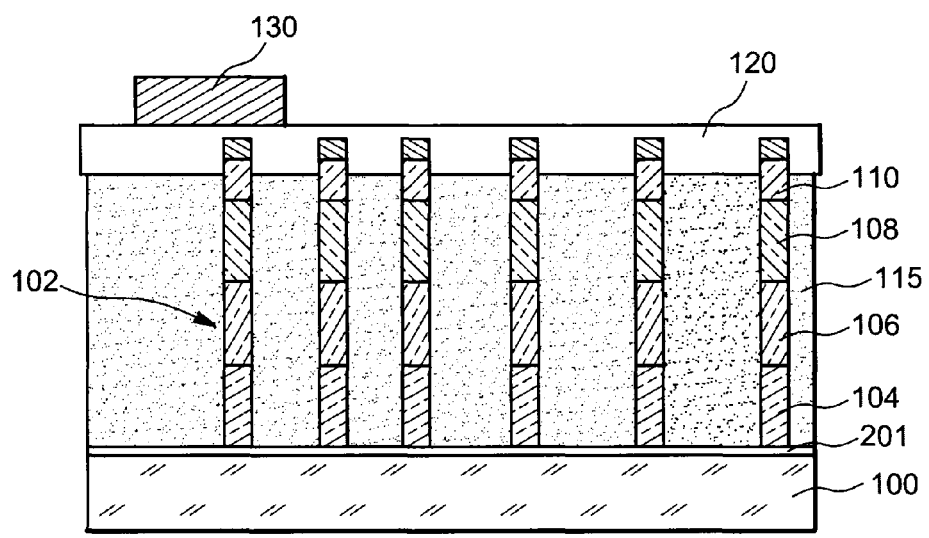
FIG. 3 illustrates an alternative method according to the invention for making a microelectronic device of the LED type, provided with nanowires formed on a metal substrate.

According to an alternative (FIG. 3) in order to improve the growth phenomenon, and in particular the nucleation phenomenon of nanowires 102 at the surface of the metal substrate 100, prior to the step for depositing the catalyst 101, a thin intermediate layer 201, which may for example be comprised between several nanometers and several microns, may be formed on the metal substrate 100. The thin intermediate layer 201 is metal and may for example be based on iron or nickel or silver or aluminium or copper silicide. The thin intermediate layer 201 is preferably based on an electrically conducting material. According to one possibility, the intermediate thin layer 201 may play the role of a reflecting layer and be provided for reflecting light radiations intended to be emitted by the nanowires 102.

The invention claimed is:

1. A method for making a light-emitting microelectronic device, the method comprising:

growing, on a continuous substrate metal layer having a thickness between 10 μm and 10 mm and belonging to a metal support, a plurality of wires based on one or plural semi-conducting materials, each wire being individually configured to emit light radiation and being formed of a first portion that is based on GaN and n-doped, said first portion being in contact with the continuous substrate metal layer, each wire being further formed of a second portion on said first portion, said second portion being a quantum well portion forming a light emitting active zone, and of a third portion on said second portion, said third portion being based on GaN and p-doped, wherein the continuous substrate metal layer reflects the light radiation emitted by the plurality of wires; and forming at least one electrically conducting contact area on at least one of the wires.

2. The method for making a light-emitting microelectronic device according to claim 1, wherein the substrate is a metal or a metal alloy comprising one of the following materials: iron, nickel, aluminum, silver, or copper.

3. The method for making a light-emitting microelectronic device according to claim 1, further comprising, prior to the growing, depositing a catalyst material layer on the metal support.

4. The method for making a light-emitting microelectronic device according to claim 3, wherein the catalyst material is gold or nickel.

5. The method for making a light-emitting microelectronic device according to claim 1, further comprising, between the growing and the forming, forming an insulating layer for encapsulating the wires.

6. The method for making a light-emitting microelectronic device according to claim 5, further comprising forming a transparent contact layer on the insulating layer so as to cover ends of the plurality of wires extending beyond the insulating layer.

7. The method for making a light-emitting microelectronic device according to claim 6, wherein the transparent contact layer is electrically conducting.

8. The method for making a light-emitting microelectronic device according to claim 7, wherein the transparent contact layer includes Ti and Au.

9. The method for making a light-emitting microelectronic device according to claim 7, further comprising forming a contact point metal area on the contact layer.

10. The method for making a light-emitting microelectronic device according to claim 9, further comprising forming a phosphor or luminophor material layer, that converts quasi mono-chromatic light into white light, on said contact point metal area and contact layer.

11. The method for making a light-emitting microelectronic device according to claim 1, wherein the continuous substrate metal layer has a surface area of between 100 mm$^2$ and 1 m$^2$.

12. The method for making a light-emitting microelectronic device according to claim 1, further comprising degreasing the continuous substrate metal layer.

13. The method for making a light-emitting microelectronic device according to claim 12, further comprising polishing the continuous substrate metal layer.

14. The method for making a light-emitting microelectronic device according to claim 1, wherein each wire includes a fourth portion on said third portion, said fourth portion being based on GaN and p++ doped.

15. A method for making a light-emitting microelectronic device, the method comprising:

growing, on a continuous substrate metal layer having a surface area of between 100 mm$^2$ and 1 m$^2$ belonging to a metal support, a plurality of wires based on one or plural semi-conducting materials, each wire being individually configured to emit light radiation and being formed of a first portion that is based on GaN and n-doped, said first portion being in contact with the continuous substrate metal layer, each wire being further formed of a second portion on said first portion, said second portion being a quantum well portion forming a light emitting active zone, and of a third portion on said second portion, said third portion being based on GaN and p-doped, wherein the continuous substrate metal layer reflects the light radiation emitted by the plurality of wires; and forming at least one electrically conducting contact area on at least one of the wires.

16. The method for making a light-emitting microelectronic device according to claim 15, further comprising, after the growing is completed, forming an insulating layer that encapsulates the wires.

* * * * *